United States Patent [19]

Johnson et al.

[11] Patent Number: 5,273,956
[45] Date of Patent: Dec. 28, 1993

[54] TEXTURED, POLYCRYSTALLINE, SUPERCONDUCTING CERAMIC COMPOSITIONS AND METHOD OF PREPARATION

[75] Inventors: D. Lynn Johnson, Wilmette; Quentin K. Robinson, Chicago, both of Ill.

[73] Assignee: Northwestern University, Evanston, Ill.

[21] Appl. No.: 219,094

[22] Filed: Jul. 14, 1988

Related U.S. Application Data

[63] Continuation-in-part of Ser. No. 69,396, Jul. 2, 1987, abandoned.

[51] Int. Cl.$^5$ ............................................. H01L 39/00
[52] U.S. Cl. .......................................... 505/1; 501/152; 501/123; 252/521; 505/780
[58] Field of Search ................. 505/1, 780; 501/123, 501/152; 252/521

[56] References Cited

U.S. PATENT DOCUMENTS 4,975,411 12/1990 Dawby .................................. 264/24

OTHER PUBLICATIONS

Bednorz et al. (1986), "Possible High $T_c$ Superconductivity in the Ba-La-Cuo Systems", Z. Phys. B., 64, 189–193.
Chu (1987), "Superconductivity above 90K", University of Houston, prepring, presented at The National Academy of Sciences, Seminar, Mar. 1987.
Hidaka, et al. (1987), "Anisotropic Properties of Superconducting Single-Crystal $(La_{1-x}, Sr_x)_2CuO_4$", J.J. Appl. Phys. Lett., 26 [4], L377.
Malozemoff, et al. (1987), "High Temperature Superconductivity Research at the IBM Thomas J. Watson and Alamaden Research Centers", IBM Research Labs preprint, Jun. 1987.
Uchida et al. (1987), "High $T_g$ Superconductivity of La-Ba-Cu Oxides", J.J. Appl. Phys. Left., 25 [1], L1-L2.
Yoshizaki et al. (1987), "Superconducting Properties of $La_{1.85}Sr_{0.15}CuO_4$ made by Hot Press and Sinter Methods", Jpn. J. Appl. Phys. Pt. 2 Let., 26 [4]L311–L313.
Wu et al. (1987), "Superconductivity at 93K in a New Mixed-Phase Y-Ba-Cu-O Compound System at Ambient Pressure", Phys. Rev. Lett. 58 [9], 908–910.

*Primary Examiner*—Mark L. Bell
*Attorney, Agent, or Firm*—Tilton, Fallon, Lungmus & Chestnut

[57] ABSTRACT

Textured, dense, polycrystalline ceramic bodies are produced by a sinter-compression process which exhibit anisotropic superconducting properties. The bodies are produced from low density aggregates of crystalline particles by applying compressive forces to two opposed faces while permitting the aggregate to expand perpendicularly to the axis of compression. This produces a microcrystalline structure predominately composed of elongated platelike grains having their broad faces generally aligned with the body faces to which the compression was applied. The resulting bodies exhibit room temperature conductivity several times greater in a direction parallel to their compression faces than perpendicular thereto.

8 Claims, 4 Drawing Sheets

SINTER-FORGING APPARATUS

TEXTURED, POLYCRYSTALLINE, SUPERCONDUCTING CERAMIC COMPOSITIONS AND METHOD OF PREPARATION

GRANT REFERENCE

This invention is based in part on research supported by the National Science Foundation (Grant DMR 8520280).

RELATED APPLICATION

This application is a continuation-in-part of co-pending application Ser. No. 07/069,396, filed Jul. 2, 1987, now abandoned.

FIELD OF INVENTION

The field of this invention is superconducting ceramic compositions and their methods of preparation.

BACKGROUND OF INVENTION

Crystalline ceramic compositions which have unit cells with superconducting planes are known and have been the subject of intensive investigation. An important general class of such crystalline ceramics is the metal oxide perovskites containing a lanthanide rare earth metal, an alkaline earth metal, and copper. One subclass of such compositions is represented by the formula $RE.M_2.Cu_3O_{7-x}$ wherein RE is the lanthanide rare earth metal, M is the alkaline earth metal, and x is less than 1 and greater than 0. Another subclass contains lanthanum together with strontium or barium, and copper (viz. La-Sr-Cu-O or La-Ba-Cu-O). The type formula is represented as $(La_{1-x}Sr_x)_2CuO_4$, where x is less than 1 and greater than 0. See Bednorz, et al. (1986), Uchida, et al. (1987), and Hadika, et al. (1987).

Japanese researchers have investigated La-Sr-Cu-O ceramics, which comprise layered perovskites of the $K_2NiF_4$-type, including particularly the superconducting properties of $La_{1.85}Sr_{0.15}CuO_4$. Yoshizaki, et al. (1987) and Hidaka, et al. (1987). Yoshizaki et al. prepared integrated samples of this composition by sintering and hot-pressing. They found that onset-temperature of the superconducting transition was almost the same for the polycrystalline sintered and hot-pressed samples. As reported by Hidaka et al., in polycrystalline specimens anisotropic electrical and superconducting properties could not be observed. These properties were necessarily studied in single crystals.

The most technically advanced superconducting ceramics are Y-Ba-Cu-O compounds, containing yttrium, barium, copper, and oxygen. Wu, et al. (1987) reported the type formula as $(Y_{1-x}Ba_x)_2CuO_{4-\delta}$. For example, in a solid-state reaction, $Y_2O_3$, $BaCO_3$ and CuO were combined in proportions so that x was 0.4. The resulting ceramic specimens were superconductive at around 93K, well above the liquid-nitrogen boiling point of 77K. This could permit the required cooling to be obtained at greatly reduced cost. It was soon learned that the Wu, et al. specimens were a mixture of superconductive and insulating phases, and that the superconductive phase was represented by the formula $YBa_2Cu_3O_{7-x}$ (or $YBa_2Cu_3O_{6+x}$). See Chu (1987 Preprint).

The present state of the superconductivity art has been currently reviewed in separate presentations by C. W. Chu and A. P. Malozemoff (1987 Preprints). Chu describes $YBa_2Cu_3O_{7-x}$ as representative of a more general class of superconductors having the general formula $RE.Ba_2Cu_3O_{7-x}$, where RE is typically a lanthanide rare earth metal, and may include Y, La, Nd, Eu, Sm, Gd, Ho, Er or Lu. Chu states that superconductivity appears to be almost independent of the specific lanthanide. Superconductors of this general class have a unit cell with an elongated c axis, and provide a plurality of superconducting planes running perpendicular to the c axis.

Malozemoff (1987 Preprint) reported on further research with respect to $YBa_2Cu_3O_{7-x}$. Superconductivity above 77K was detected in films formed by electron-beam deposition and plasma spraying, and single crystals were synthesized and shown to exhibit a high degree of anisotropy. A reference was made to then unpublished experiments of Chaduhri, et al., in which electron-beam-deposited Y-Ba-Cu-O films were found to form preferentially-oriented films. Malozemoff expressed the opinion that "new techniques" would need "to be devised to orient grains in applications incompatible with single-crystal substrates"

SUMMARY OF INVENTION

This invention is based on the discovery that textured, dense, polycrystalline, superconducting ceramic bodies can be produced by sinter-forging aggregates of superconducting ceramic crystals. A highly oriented crystalline structure is produced which provides electrical conduction from grain-to-grain.

Heretofore the consolidation of superconducting crystalline particles into polycrystalline bodies has failed to demonstrate significant anisotropic properties with reference to electrical conductivity or magnetic properties. In contrast with prior experiments, the polycrystalline ceramic bodies of this invention are textured and exhibit room temperature (e.g. 298 K.) electrical conductivity along a preferred axis several times greater than transverse to this axis. These bodies therefore can function as anisotropic superconductors.

To achieve the results of the present invention, it is believed important to compress the crystalline particles under special controlled conditions. A temperature effective for particle sintering is used, and the compression force is applied against oppositely-disposed surfaces of the body. For example, the top and bottom planar surfaces of a ceramic aggregate body formed by cold-pressing can be used as the compression surfaces. Critically, the compression is carried out while permitting the aggregate as it compresses to elongate in at least one direction at right angles to the axis of compression. For example, the particulate aggregate being compressed between its top and bottom surfaces may have each of its side surfaces unconfined. The compression then increases the lateral dimensions in all directions at right angles to the compression axis. In another embodiment, the side surfaces of the body are confined with elongation permitted primarily in a longitudinal direction.

In a specific embodiment, the starting material for preparing the superconducting polycrystalline bodies of this invention is the irregular crystalline particles produced by fine grinding of a superconducting perovskite-type crystalline composition. Aggregates of the particles are formed, for example, by cold pressing or other suitable cold integration procedure. In such aggregates the crystal grains may have a fully or partially random orientation. Such coldformed aggregates usually are of low density and even if sintered the density remains relatively low. For example, the cold-pressed aggregates may have a density of around 50 to 65% of theoretical while sintering can increase the density to about 70 to 90%, which does not provide for adequate strength. By the method of this invention densities in excess of 95% theoretical are obtained, ranging for example from 97 to 99%.

It was unexpected to find that compression by the method of this invention produced enlarged grains in the form of platelike crystals oriented edge-to-edge, and thereby providing paths for electrical conductivity running generally perpendicular to the axis of compression. Consequently, the resulting bodies although polycrystalline display highly significant anisotropic superconducting properties. As far as is known, this has not been previously reported for polycrystalline ceramic bodies.

THE DRAWINGS

The accompanying drawings and photographs will facilitate the understanding of this invention.

FIG. 1A is a detail view of the apparatus of FIG. 1 showing the apperance of the ceramic body after completion of the sinter-forging;

FIG. 7A is a diagrammatic side elevational view of a hot rolling apparatus for producing ceramic bodies of this invention in the form of elongated ribbons; and FIG. 7B is an end elevational view of the apparatus of FIG. 8, illustrating the ribbon-forming cavity between the rolls.

DETAILED DESCRIPTION

Figure 2:
FIG. 2 is a greatly enlarged illustration of a portion of the ceramic aggregate prior to sinter-forging.

The starting material for use in preparing the ceramic bodies of this invention comprises ultra-fine crystals of ceramic compositions of the kind providing a crystal unit cell with at least one set of superconducting planes extending perpendicular to an axis thereof. As described in the literature references cited in the introductory portion of the specification, such crystalline ceramics can be produced by solid state reaction of metal oxides in selected proportions. However, any method of powder synthesis can be used. Typically, a rare earth oxide of the lanthanum family is reacted with an alkaline earth carbonate and copper oxide. For example, yttrium or lanthanum oxide ($Y_2O_3$; $La_2O_3$) are reacted with barium or strontium carbonate ($BaCO_3$; $SrCO_3$) and cupric oxide (CuO). The single phase crystalline material produced by the reaction is subjected to a comminution operation to obtain a micronized powder. For example, fine grinding can be used. The size of the particles should be adapted for sintering. In general, mean particle sizes smaller than 50 microns are usable, but even smaller size particles are preferred, such as a mean size less than 10 microns. Particle sizes in the range from 0.5 to 5 microns are especially advantageous. The particles used may be single or polycrystalline. Further, the particles may have irregular boundaries due to comminution, or they may be regular crystal shapes. The appearance of irregular singlecrystal ceramic particles (greatly enlarged) is illustrated in FIG. 2.

Although the method and products of this invention are not limited thereto, a preferred ceramic composition, as presently known, is represented by the formula $RE.M_2.Cu_3O_{7-x}$ wherein RE is a lanthanide rare earth metal, M is an alkaline earth metal, and "x" is a number less than 1 and greater than 0, viz., x is 0.1 to 0.4 giving an oxygen content of 6.6 to 6.9. Optimized examples of superconducting compositions of this formula are ones in which the crystal unit cells are superconductive at temperatures above 77 K, and which provide a plurality of conductive planes extending perpendicular to the long axis of the cell (the c axis), so that the crystalline ceramic particles which are subjected to sinter-forging are in a superconductive state. One optimum formula is represented by $YBa_2Cu_3O_{7-x}$ in which Y is yttrium, Ba is barium, and x is a number less than 1 and greater than 0. For use in the process of this invention, the oxygen content of the crystalline starting material should be in the range from 6.6 to 6.9 or 7, and preferably 6.7 to 6.9. It should be understood that this is a type formula in which substitutions of equivalent elements can be made. For example, it is known that nickel (Ni) can be partially substituted for copper (Cu), and that fluorine (F) can be partially substituted for oxygen (O). Where required to make the individual crystals superconducting, they may be oxygen-annealed, such as by heating in an oxygen atmosphere at 450°-550° C., as described by Kao (1987). Alternatively, the superconducting crystals may be prepared with barium peroxide ($BaO_2$) as the barium source (Phillip, et al., 1987).

In a preparatory step, portions of the crystal particles are united into low density aggregates. The aggregates may be formed in molds with or without application of heat to obtain integrated masses of crystals having densities of from 50 to 90% of theoretical, typically from 50 to 75%. For example, integration can be accomplished by pressing a mass of the crystalline ceramic particles at a temperature below the sintering temperature range. The integrated aggregates preferably have opposed, generally parallel faces. Heat-decomposable binders can be mixed with the crystalline particles to promote integration and can be removed by heating the aggregates before processing by the method of this invention. If sufficient pressure is applied, the particles can be cold-formed without a binder. Other methods of producing integrated preforms can be used. Such methods include tape casting, calendering, extrusion, injection molding, etc.

In the key step of the method, the ceramic aggregates are heated to a temperature in the sintering temperature range for the ceramic particles; and concurrently, a compressive force is applied which is directed at right angles to their planar faces. In other words, the compression or forge axis is perpendicular to the planar faces of the body to which the compression is applied.

The planar faces of the aggregate are thereby subjected to uniaxial compression.

The temperature selected should be one at which the compresse particles are capable of uniting by sintering as distinguished from melting or fusion. Such sintering temperatures are readily determinable for any specific particulate ceramic aggregates. However, they may vary considerably, depending on the particle sizes and the method used to form the ceramic powder. In certain embodiments, sintering temperatures are in the range from 900° to 1000° C., such as around 950°-960° C. The required sintering temperatures and pressure are easily produced with conventional equipment for singer-forging, hot-rolling, swaging, and similar operations.

It is important to permit spreading of the aggregate, as it is compressed. In the compression procedure illustrated in FIG. 1, the aggregate can expand during compression. In certain embodiments, the compressive force can be in the range from about 1 to 5 MPa (145 to 725 psi). With some powders, higher pressures may be needed.

The applied pressure at the sintering temperature should be sufficient to increase the density of the aggregate to over 95% (viz. 95 to 100%) of theoretical density, such as to a density in the range of 97 to 99%.

As a result of the described sinter-compression step, not only is the density increased but in the process grain growth and grain orientation occur. The resulting polycrstalline material is composed largely of elongated platelike crystals having intimate edge-to-edge boundary contacts with the adjacent crystal plates. The resulting microcrystalline structure will have a high degree of crystal alignment. More specifically, it will be composed predominately of the platelike grains which have braod faces and narrow edges. The long axes of the plate-form grains will be aligned with the body faces to which the compression force was applied. This alignment can be visualized by references to FIG. 3. The platelike grains have their broad faces aligned generally perpendicularly to the compression axis. Exactly perpendicular alignment is not required for achieving the superconducting benefits of the present invention. The broad faces of the grains can form small acute angles with the plane at right angles to the compression axis. By the term "generally aligned" is meant that more than 50% of the platelike grains have their broad faces disposed within 0° to 30° of a perpendicular alignment with respect to the axis of compression. In preferred embodiments, more than 75% of the crystal plates will have this alignment. The alignment described produces a high percentage of grains in edge-to-edge contact, as distinguished from edge-to-face contact. It is believed to be edge-to-edge grain junctures which provide electrical conductivity between the superconducting planes of the individual grains. On the other hand, the edge-to-face junctures are thought to be insulating.

It has been confirmed experimentally that the polycrystalline bodies of the present invention do display significant anisotropic conductivity in accordance with the crystalline structure. Room temperature conductivity (resistivity) measurements established that in directions parallel to the compression-applied body faces, the polycrystalline bodies displayed more than twice as great conductivity (less than half the resistivity) as in directions perpendicular to the faces. The room temperatures (298 K) conductivity measurements are an index of superconductivity. The maximum room temperature anisotropic conductivity obtainable by the method of this invention is not yet known. Samples have been produced and tested which have around four times the 298 K conductivity in a direction at right angles to the axis of compression.

DISCUSSION OF DRAWINGS

Referring now to the drawings, the method and products of this invention will be further illustrated.

Figure 1:
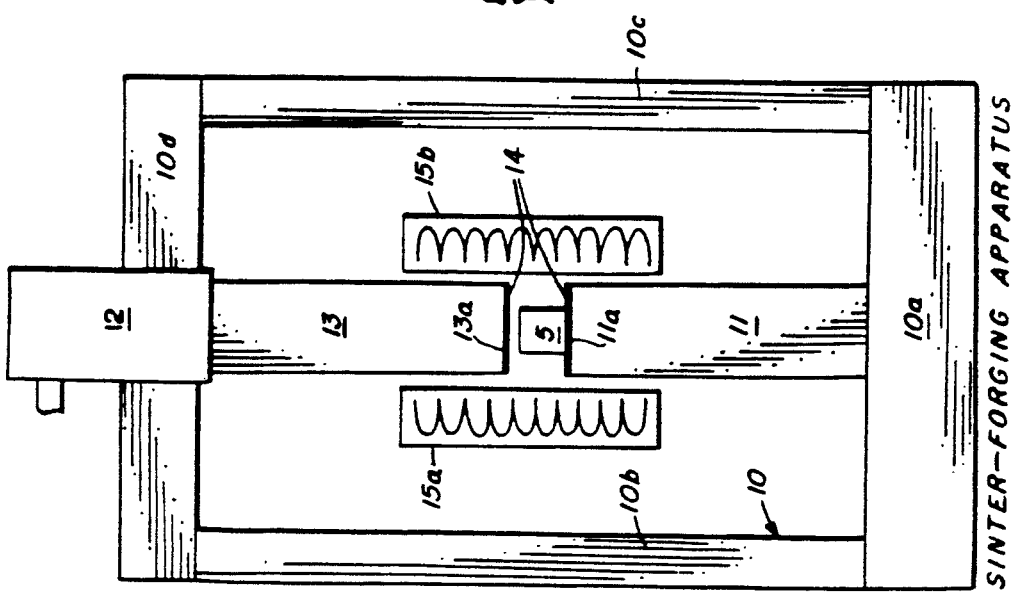
FIG. 1 is a diagrammatic illustration of a sinter-forging apparatus, showing a cold-pressed aggregate of superconducting ceramic particles in position for processing.

In FIG. 1, there is shown a sinter-forging apparatus including a perimetric support frame 10, having a base 10a, side members 10b and 10c, and a top member 10d. A fixed ram 11 is rigidly mounted on base 10a, and is provided with a flat, horizontally disposed upper end 11a. A hydraulic cylinder 12 is rigidly mounted in the center of frame member 10d for operation of the upper movable ram 13, which is axially aligned with lower ram 11, and also provides a flat horizontally extending end 13a. These rams are preferably formed of a high temperature resistant material such as alumina. To further minimize reaction of the ram surfaces with the ceramic material being processed, the ends of the rams may be covered or coated with metals or other materials of low activity. For example, a platinum layer is suitable. Such a protective layer is indicated in the drawing by the number 14.

The sinter-forging apparatus of FIG. 1 also includes a resistance heating furnace, the coils of which are indicated at 15a and 15b. It will be understood that the apparatus will have an enclosure designed to retain heat and including a door for access to the forging chamber, so as to permit introduction and removal of the material being processed. During the sinter-forging operation, the interior of the chamber may be maintained under oxidizing or other controlled atmosphere. It is desirable to avoid reduction of the metallic oxides during the processing.

In FIG. 1 there is shown a cold-pressed aggregate as it would appear on introduction to the forging apparatus. In FIG. 1A, a view of the sample after compression is shown. Since the method illustrated is essentially one of open die-forging, the sample can expand laterally during the compression. The crystalline aggregate form of the samples, represented in FIG. 2, is transformed into the oriented, platelike grain structure illustrated in FIG. 3.

Figure 4:
FIG. 4 is a crossed polarizer photomicrograph of a polished section of a sinter-forged sample, the section being parallel to the compression axis, and the compression direction being normal to the long direction of the photomicrograph.
Figure 5:
FIG. 5 is a crossed polarizer photomicrograph of another area of the same sample as FIG. 4, the compression axis being at an angle of approximately 45° from the long direction of the micrograph.
Figure 6:
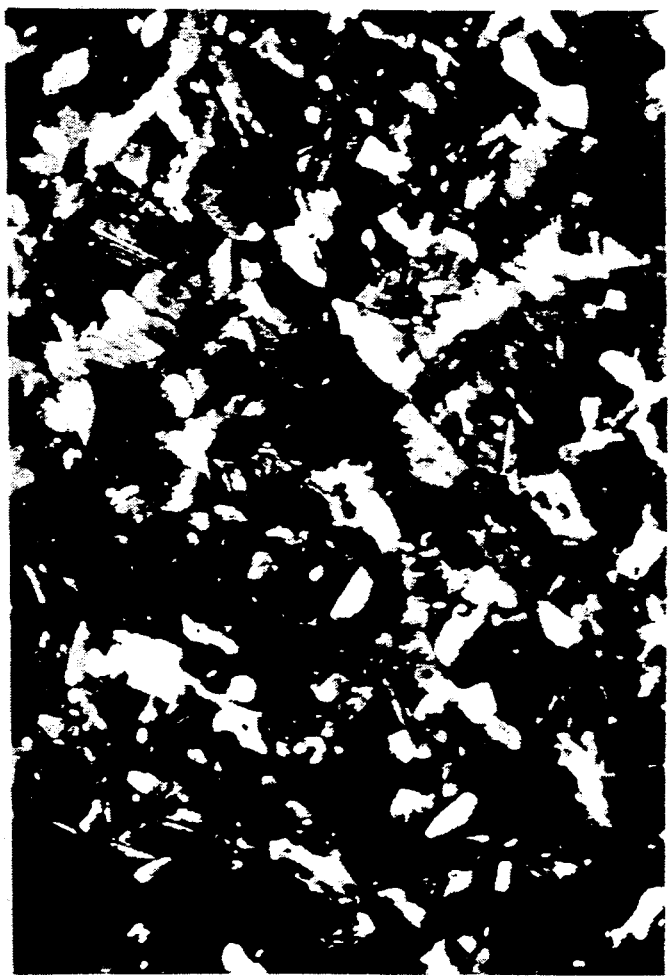
FIG. 6 is a crossed polarizer photomicrograph of a polished section of a sinter-forged sample in which the section is normal to the compression direction.

FIGS. 4, 5, and 6 are photomicrographs of polished sections of singer-forged samples produced as described with reference to FIG. 1, the sections being viewed under crossed polarizers at X480 magnification.

The FIG. 4 section was made parallel the forge axis, and the forging direction was normal to the long direction of the micrograph. The dark grains are all in a state of extinction, i.e., parallel to the plane of polarization of either the polarizer or the analyzer. It can be seen that the large majority of the grains in this figure are in this state of extinction, indicating that their conductive planes are parallel to each other.

FIG. 5 is a view of another area of the same sample as FIG. 4 at the same magnification, except that in this case the specimen has been rotated relative to the polarizer and analyzer so that most grains are not in extinction. The forge axis is at an angle of approximately 45° from the long direction of the micrograph.

FIG. 6 is a section of a sinter-forged sample in which the section is normal to the pressing direction. A significant fraction of the visible grains are not optically active, and appear dark in this micrograph. The rectangular grains that are optically active can be seen to lie in random directions.

Figure 3:
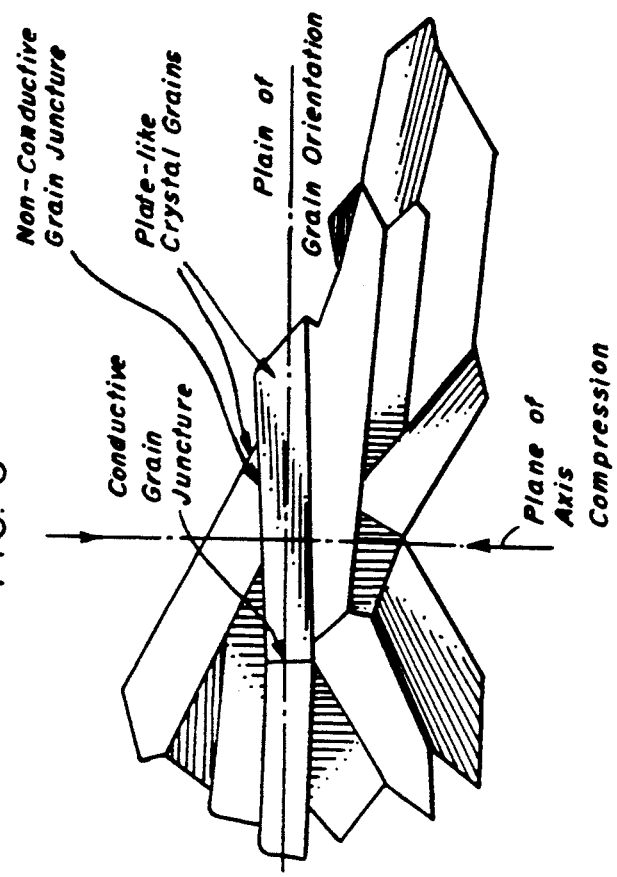
FIG. 3 is a greatly enlarged illustration of a cross-section of the platelike grain structure resulting from the sinter-forging.

The micrographs demonstrate the alignment of the grains achieved by sinter-forging, and that the alignment is essentially as illustrated in the drawing of FIG. 3. As determined by resistivity measurements which will be described in the experimental examples, it was determined that the conductive planes lie generally parallel to the broad faces of the platelike grains. This permits current to pass between the grain edge boundaries.

EXPERIMENTAL EXAMPLES $YBa_2Cu_3O_{7-x}$ powders were made by the solid state reaction of reagent grade $Y_2O_3$, $BaCO_3$, and $CuO$. This process consisted of calcining at 900° C. for 22 h followed by a 950° C. soak in air for an additional five days. The powder was removed from the furnace and reground in a mortar and pestle five separate times to hasten the reaction. X-ray diffraction (XRD) revealed single phase $YBa_2Cu_3O_{7-x}$. The crystals were superconducting as a result of the process of preparation, and had an estimated oxygen content of 6.7 to 6.8. The powder (with no binder added) was pressed into 2-3 gram pellets in a 12 mm dimeter double action die at 76 MPa.

Sinter-forging was carried out in a resistance furnace. The samples were placed between 20 mm diameter alumina rams, separated from the rams by 25 $\mu$ thick platinum foil. Forging was carried out at 975° C. for one hour under a constant force of 600N in flowing oxygen. Densities were measured by the Archimedes technique.

DC magnetic susceptibilities were measured with a susceptometer. The upper critical field slope near the transition temperature was measured to be $-10$ KOe/K by sweeping the temperature at different fixed fields. Four-probe AC conductivity measurements were made with an automated charge transport measurement system. Samples were mounted with 25 $\mu$m gold wire leads (attached with gold paste) both parallel and perpendicular to the forge axis.

Results

These sinter-forging experiments demonstrated that substantial deformation occurs at relatively low pressures and that enhanced densification can be obtained. The diameter of forged specimens was commonly greater than the diameter of the alumina rams.

The sinter-forged samples typically exhibited four distinct regions. The surfaces in contact with the platinum displayed an unidentified reaction zone (<0.5 mm). A second region formed circumferentially on the rim of the sample. This region was characterized by deep axial cracks and was not as dense as the interior regions. A third zone formed a ring interior to the second zone. This third region was seen visually as different from either the interior (fourth region) or the second region and had a lower density than the fourth or interior region. The interior of the sample was single phase $YBa_2Cu_3O_{7-x}$ by XRD and exhibited a high percentage of theoretical density. For example, a sample that was sinter-forged at 975° C. for 1 hr. exhibited a density of 95% of the theoretical value for the interior region. That the interior was indeed superconducting $YBa_2Cu_3O_{7-x}$ was confirmed by the characteristic signatures in Meissner effect and conductivity measurements.

Samples were sectioned and polished to a 1 $\mu$m diamond paste finish. The sections included those described above with reference to FIGS. 4, 5, and 6. Optical micrographs taken under crossed polarized conditions in reflected light. Morphological texturing was evident, as well as extensive twinning in the plate-like grains in sections like FIGS. 4 and 5. Importantly, a morphological texturing was not observed in polished sections perpendicular to the forge axis like FIG. 6.

A photovoltaic cell was placed in the eyepiece of the microscope under the same conditions as the aforementioned micrographs were taken. The cell integrated the light intensity over more than 100 grains. The stage was rotated through 360° and the output was measured for every 10 degrees of rotation. Extinction minima occur at 90° intervals with the maxima occurring midway between the minima. The photovoltaic cell output as a function of rotation for the sample section perpendicular to the forge axis was constant.

Extinction minima occurring at 90° intervals provide strong evidence of preferred orientation of grains in the face parallel to the forge axis. The integrated light intensity as a function of rotation for a random polycrystalline aggregate should not exhibit minima, and hence the orientation of grains in the face perpendicular to the forge axis is essentially random.

The two orthogonal faces, one parallel and the other perpendicular to the forge axis, were examined with a rotating anode X-ray generator equipped with a powder diffractometer. Copper radiation was employed, and the diffraction patterns were sampled at 0.02 2θ intervals, counting for 1 or 3s at each step.

The diffractometer scans were strikingly different from one another, indicative of a highly textured material. These results indicate a marked preference for the c-axis to be aligned parallel to the forge axis.

Further information on the structural anisotropy induced by the sinter-forging was provided by variable temperature conductivity measurements parallel and perpendicular to the forge axis. There was marked anisotropy in the electrical conductivity. The conductivity was greatest in the direction perpendicular to the forge axis, i.e., perpendicular to the crystalline c axes. This result is in excellent agreement with band structure calculations on such materials which predict maximum conductivity in sheets extending perpendicular to c. The superconducting transition appeared to be considerably narrower, and at a higher temperature, in the direction perpendicular to the forge axis.

Discussion

These results demonstrate that the sinter-forging method was successful in achieving high density polycrystalline $YBa_2Cu_3O_{7-x}$. Relatively low pressure, viz. 2 to 4.5 MPa (the pressure on the sample varies with deformation), resulted in greatly increased density. In addition and of major significance, the results provide strong evidence for texturing or preferred orientation of the $YBa_2Cu_3O_{7-x}$ microstructure. In particular, the X-ray diffraction results indicate that the c axis is preferentially parallel to the forge axis with the a-b plane lying more or less perpendicular to the forge axis. The a-b plane is therefore probably the metallic crystallographic direction. The measurements of the charge transport anisotropy in $YBa_2Cu_3O_{7-x}$ seem to confirm this.

Summarizing, for the first time a textured, dense, polycrystalline, superconducting ceramic material has been produced, and its anisotropic conducting properties confirmed. The practical and commercial utility of this invention is believed to be of a high order.

REFERENCES

Bednorz et al. (1986), "Possible High $T_c$ Superconductivity in the BLa:Ba–CuO Systems", Z. Phys. B, 64, 189–193.

Chu (1987), "Superconductivity above 90 K", University of Houston, preprint, presented at The National Academy of Sciences Seminar, March 1987.

Hidaka, et al. (1987), "Anisotropic Properties of Superconducting Single-Crystal $(La_{I-x}, Sr_x)_2CuO_4$", J. J. Appl. Phys. Lett., 26 [4], L377

Kao (1987), "Synthesis of Y-Ba-Cu-O Superconductors from $Y_2O_3$, $BaO_2$, and $Cu_2O$: The Optional Oxygen Treatment", Mater. Letts., 6 [3]53–57.

Malozemoff, et al. (1987), "High Temperature Superconductivity Research at the IBM Thomas J. Watson and Alamaden Research Centers", IBM Research Labs preprint, June 1987.

Phillip, et al. (1987), "Advantages of Barium Peroxide in the Production of Perovskite Superconductors", preseted at the 1987 Fall Meeting of the Materials Research Society, Boston, Mass. November, 1987.

Uchida et al. (1987), "High $T_c$ Superconductivity of La-Ba-Cu Oxides", J. J. Appl. Phys. Lett., 25 [1[, L1-L2.

Yoshizaki et al. (1987), "Superconducting Properties of $La_{1.85}Sr_{0.15}CuO_4$ Made by Hot Press and Sinter Methods", Jpn. J. Appl. Phys. Pt. 2 Let., 26 [4] L311-L313.

Wu, et al. (1987), "Superconductivity at 93 K in a New Mixed-Phase Y-Ba-Cu-O Compound System at Ambient Pressure", Phys. Rev. Lett, 58 [9], 908–910.

We claim:

1. A textured, dense, polycrystalline ceramic body exhibiting anisotropic superconducting properties and having opposed faces to which uniaxial compressive force was applied in the forming thereof at a sintering temperature, said body having the following additional characteristics:
   (a) being composed of a ceramic composition represented by the formula $RE\ M_2Cu_3O_{7-x}$, wherein RE is a lanthanide rare earth metal, M is an alkaline earth metal, and x is a number less than 1 and greater than 0, said composition having a crystal unit cell with an elongated c axis and one or more sets of superconducting planes extending perpendicular to the c axis thereof;
   (b) having a density greater than 95% of theoretical produced by said uniaxial compressive force applied at a sintering temperature;
   (c) having a microcrystalline structure predominately composed of elongated platelike grains having their broad faces generally aligned parallel to said body faces; and
   (d) exhibiting electrical conductivity at 298 K in a direction parallel to said body faces more than twice as great as in a direction perpendicular to said faces.

2. The superconducting ceramic body of claim 1 in which said ceramic composition is represented by the formula $RE.M_2.Cu_3O_x$ wherein RE is a lanthanide rare earth metal, M is an alkaline earth metal, and x is a number from 6.6 to 6.9.

3. The superconducting ceramic body of claim 1 in which said ceramic composition is represented by the formula $YBa_2Cu_3O_x$ in which Y is yttrium, Ba is barium, Cu is copper, and x is a number from 6.6 to 6.9.

4. The superconducting ceramic body of claims 1, 2 or 3 in which said body has a density in the range from 97 to 99% of theoretical.

5. The superconducting ceramic body of claims 1, 2 or 3 in which said body exhibits an electrical conductivity at 298 K in a direction parallel to said body faces at least about four times larger than in a direction perpendicular to said faces.

6. A textured, dense, polycrystalline ceramic body exhibiting anisotropic superconducting properties and having opposed faces to which uniaxial compressive force has been applied in a direction perpendicular to the faces in forming said body at a sintering temperature, said body having the following additional characterics:
   (a) being composed essentially of a ceramic composition represented by the formula $YBa_2Cu_3O_{7-x}$ in which Y is yttrium, Ba is barium, Cu is copper, and x is a number less than 1 and greater than 0, said composition having a crystal unit cell with an elongated c axis and providing a plurality of superconducting planes extending perpendicular to the c axis;
   (b) having a density in the range of 97 to 99% of theoretical produced by said uniaxial compressive force applied at a sintering temperature;
   (c) having a microcrystalline structure predominately of elongated platelike grains having their broad faces generally aligned parallel with said body faces; and
   (d) exhibiting an electrical conductivity at 298 K in a direction parallel to said body faces more than twice as great as in a direction perpendicular to said faces.

7. The superconducting ceramic body of claim 6 in which said ceramic composition is represented by the formula $YBa_2Cu_3O_x$ in which Y is yttrium, Ba is barium, Cu is copper, and x is a number from 6.7 to 6.8.

8. The superconducting ceramic body of claim 6 or claim 7 in which said body exhibits an electrical conductivity at 298 K in the direction parallel to said body faces at least four times larger than in the direction perpendicular to said faces.

* * * * *